United States Patent [19]

Tomosada et al.

[11] Patent Number: 4,674,863

[45] Date of Patent: Jun. 23, 1987

[54] IMAGE FORMING APPARATUS CONTROLLED BY A PLURALITY OF IMAGE DENSITY DETECTORS

[75] Inventors: Masahiro Tomosada, Kawasaki; Masanori Miyata, Yokohama; Hideki Adachi, Kawasaki; Yukio Sato, Inagi, all of Japan

[73] Assignee: Canon Kabushiki Kaisha, Tokyo, Japan

[21] Appl. No.: 637,792

[22] Filed: Aug. 6, 1984

[30] Foreign Application Priority Data

Aug. 10, 1983 [JP] Japan ................................ 58-145120
Aug. 10, 1983 [JP] Japan ................................ 58-145121
Aug. 10, 1983 [JP] Japan ................................ 58-145122

[51] Int. Cl.⁴ .......................................... G03G 15/00
[52] U.S. Cl. .................................... 355/14 E; 355/68
[58] Field of Search ............... 355/14 R, 14 E, 14 D, 355/14 CH, 68, 69

[56] References Cited

U.S. PATENT DOCUMENTS

| | | | |
|---|---|---|---|
| 3,650,624 | 3/1972 | Yamada | 355/69 |
| 3,864,035 | 2/1975 | Kuehnle | 355/14 R |
| 4,239,374 | 12/1980 | Tatsumi et al. | 355/14 E |
| 4,378,153 | 3/1983 | Nishimura et al. | 355/1 X |
| 4,390,266 | 6/1983 | Uchida | 355/14 D X |

Primary Examiner—A. T. Grimley
Assistant Examiner—J. Pendegrass
Attorney, Agent, or Firm—Fitzpatrick, Cella, Harper & Scinto

[57] ABSTRACT

An improved image forming apparatus for controlling image density at an optimum level. The image forming apparatus has a plurality of detectors for detecting an original image density. The detectors have mutually different detecting characteristics, wherein image forming conditions are controlled based on the outputs of the detectors. Control may be effected in accordance with a comparison of the detected values, and in accordance with a selected operation mode.

57 Claims, 9 Drawing Figures

IMAGE FORMING APPARATUS CONTROLLED BY A PLURALITY OF IMAGE DENSITY DETECTORS

BACKGROUND OF THE INVENTION

1. Field of the Invention

This invention relates to an image forming apparatus which detects the image density and forms an optimum image according to the detected value.

2. Description of the Prior Art

In general, an image forming apparatus, such as a copying machines, is equipped with a manual density control means for setting its copying density at a desired level. This is done by manually operating a lever, or the like, to set quantity of exposure, development bias potential, etc. Some apparatuses have an automatic density control means for setting the density by an output from a detector which detects the density of an original. Their operation is based on a signal from the detector, the quantity of exposure to the photosensitive body, developing bias potential and similar other conditions. These are automatically controlled, so as to adjust the copying apparatus, by having a detector of the density of an original. Some alternatives have been proposed, as mentioned below.

An automatic exposure (AE) control device is available, which determines the density of an original, by a detection process that uses a light-receiving element for estimating the quantity of light reflected from the original under an illuminating lamp, and adjusting the quantity of light exposed to the photosensitive body based on the detected value.

However, the above image density control device includes drawbacks, in that the quantity of exposing light cannot always be controlled with accuracy, because of the effects caused by temperature drift of the light-receiving element, or the temperature or humidity characteristics of a photosensitive body.

Also known is a device which determines the density of originals by detecting the electric potential of a photosensitive body with an electric potential sensor. It controls the amount of light exposed to the photosensitive body, based on the determined value, and automatically sets the density of a copy image at an optimum level. The device has drawbacks, in that the position of the photosensitivity of a body, amenable to detection with an electric potential sensor, is limited. Furthermore, the density of the original can be only partly determined, and thus optimal density can not be obtained on some originals.

SUMMARY OF THE INVENTION

In view of the above-mentioned drawbacks, it is an object of this invention to provide an improved image forming apparatus for controlling image density at an optimum level.

This invention is meant also to provide an image forming apparatus which is capable of controlling the relevant conditions, by compensating for any detection error in regard to the density of the originals.

Further, this invention seeks to provide an image forming apparatus in which a mode for setting an optimum image density can be selected so as to conform to the state of the original. At the same time, a purpose of this invention is to provide an image forming apparatus which detects the density of an original image, by using several detection means each having mutually different detecting characteristics, and controls the image forming conditions based on the resultant outputs.

This invention can provide an image forming apparatus which detects the density of originals by using several detection means to compare the output and, when the output is in a predetermined state, forms an image on the basis of the previously determined image forming conditions.

This invention can provide an image forming apparatus which detects the density of an original by several detecting means and selects a mode for setting the image density.

This invention can provide an image forming apparatus which detects the density of the original by several detection means and selects either a mode for manually setting the density or a mode for automatically setting the density corresponding to an output.

This invention can further provide an image forming apparatus, which detects the density of an original by two detecting means, controls image forming conditions according to the output from a detecting means, and delimits the above-mentioned image forming conditions according to the output derived from the other detecting means.

The above features of the invention are high-lighted the following description.

DETAILED DESCRIPTION OF THE PREFERRED EMBODIMENT

An embodiment of the invention will now be described with reference to the drawings.

Figure 1:
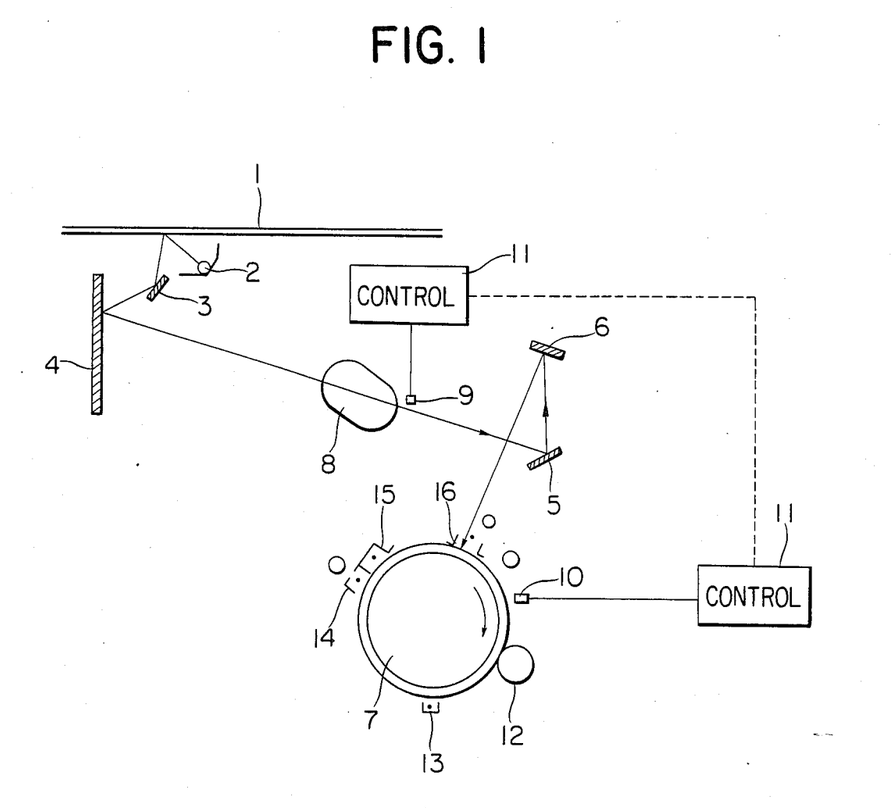
FIG. 1 is a view of the fundamental composition of the electronic photo-copying machine, according to the invention.

FIG. 1 is a schematic diagram showing the fundamental composition of the electronic photo-copying machine according to the invention, in which 1 denotes a contact glass; and 2 is an exposing lamp (halogen lamp), positioned under the contact glass 1; 3, 4, 5, and 6 denote a arrangement composing an optical system for projecting the reflecting light from the original onto a recording medium such as the drum or photosensitive body 7. Element 8 is an image forming lens; elements 9 and 10 each detect states of the original image and include a light-receiving sensor comprising a detector for detecting the density of the original (1st detecting means) and a potential sensor (2nd detecting means), the said light-receiving sensor being disposed close to the above-mentioned optical system, and the potential sensor being disposed close to the surface of the photosensitive body 7. Element 11 denotes a control circuit for receiving the detection signal from the light-receiving photosensor 9 and potential sensor 10, the said circuit composing means for adjusting the amount of exposure to the light from the exposure lamp 2, together with a circuit for controlling the amount of light; 12 denotes a developer arranged around the photo-receiving body 7; 13 denotes an electrode for image transfer; 14 is a pre-discharging device for statically equalizing the surface of the photo-receiving body 7; 15 denotes a charging device for charging uniformly the photo-receiving body 7, with positive or negative charge; and 16 denotes an AC charging device for discharging the above-mentioned photosensitive body 7, simultaneously with the exposure.

Figure 2:
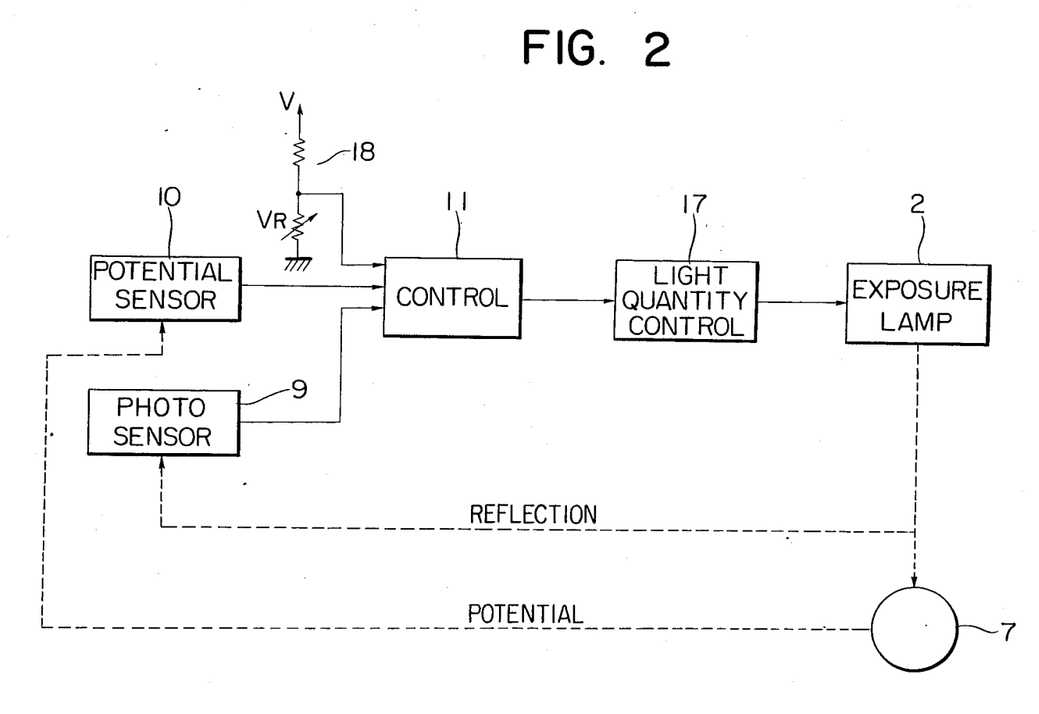
FIG. 2 is a block diagram showing the fundamental composition of the control device, according to an embodiment of the present invention.

FIG. 2 is a block diagram showing the fundamental composition of the above control device of the copying machine, in which 17 designates the control circuit of the light quantity for controlling the exposed quantity of light from the exposure lamp 2; 18 denotes a manual density setting mode comprising a manual density setting circuit for manually setting the density of the image at a desired level and changing the resistivity of the variable resistance $V_R$, interlocked with a lever or the like (not shown).

With reference to the above composition, the action of the apparatus will be described below. The conventional copying procedures, well known in the art, will not be described in detail.

The surface of the photosensitive body 7 is charged uniformly by corona discharge from the charging devices 14, 15 and 16, and then static image is formed, corresponding to the original in terms of the reflected light from the original. This latent image is then visualized by attraction of a developer in the developing device 12. The image thus formed is then transferred to copying paper, wound on a transfer drum (not shown), by the transferring electrode 13, to form a copy of the original, after fixation by a toner in a fixing device not shown in the drawings.

Here, the procedure of formation of the static image will be described in detail.

The electronic photo-copying machine, shown in FIGS. 1 and 2, is equipped with a means for detecting the density of the original and an automatic density-setting mode for the copy image at a proper level, based on a detection signal from the detecting device. The machine is equipped with a light-receiving sensor 9, which detects the amount of light reflected from the original, and an electric potential sensor, 10, which detects the state of the photosensitive body 7; and the machine is designed to compare the signals from two sensors, 9 and 10, and, when the signals are found to be in the predetermined state, conduct the copying operation under the previously set conditions. In other words, when a significant difference is present between the density values detected by the two sensors, 9 and 10, an optimum AE control is carried out by using the two sensors, 9 and 10, having different detecting functions, since the original is scanned with a predetermined quantity of light exposure, corresponding to the density of the original as detected by the sensors, 9 and 10.

Figure 3:
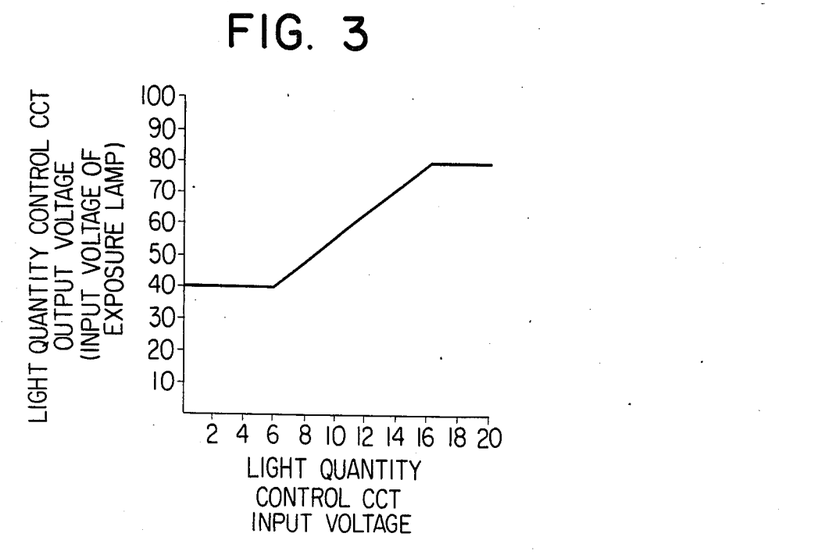
FIG. 3 is a graph showing the input and output potential characteristics of the circuit for controlling the quantity of light.

FIG. 3 shows the input-output voltage characteristics of the light quantity control circuit, 17. The light quantity affecting the photosensitive body, 7, is controlled by changing the applied voltage to the exposure lamp, 2, according to a signal from the control circuit, 11.

Figure 4:
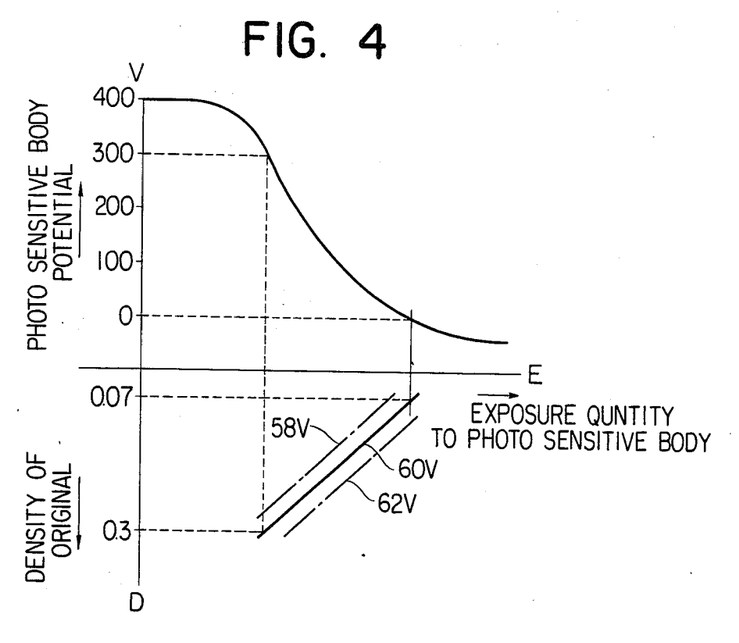
FIG. 4 is a graph showing the relationship of exposure quantity to the photosensitivity of the body, surface potential of the photosensitive body, and density of the original.

FIG. 4 shows the relationship of the exposure quantity, affecting the photosensitive body, 7, with the surface potential of the photosensitive body and the density of the original. For example, when the applied voltage of the exposure lamp 2, illuminating the original, is 60 V, and if the density of original is 0.07 (the same as that of a standard white plate), the potential of the surface of the photosensitive body, 7, is 0 V. However, if the density of the original is 0.3 (grey color), the potential of the surface of the photosensitive body is 300 V.

Figure 5:
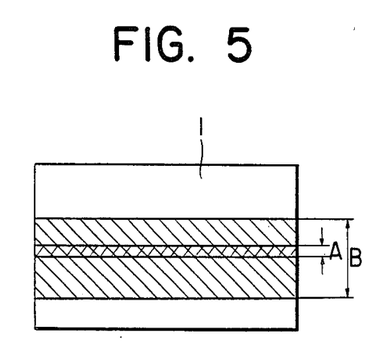
FIG. 5 is a view showing the region of the original, of which density is detected by each of the sensors.

FIG. 5 is a view showing the region of the original, of which the density is detected by either of the sensors, 9 and 10. The area indicated by A of the original placed on the original supporting table, i.e. contact glass 1, is detected by the potential sensor, 10, and the area indicated by B is detected by the photo sensor, 9.

FIG. 5 shows that the region detected by the photo sensor, 9, is broader than that detected by the potential sensor, 10.

Figure 6:
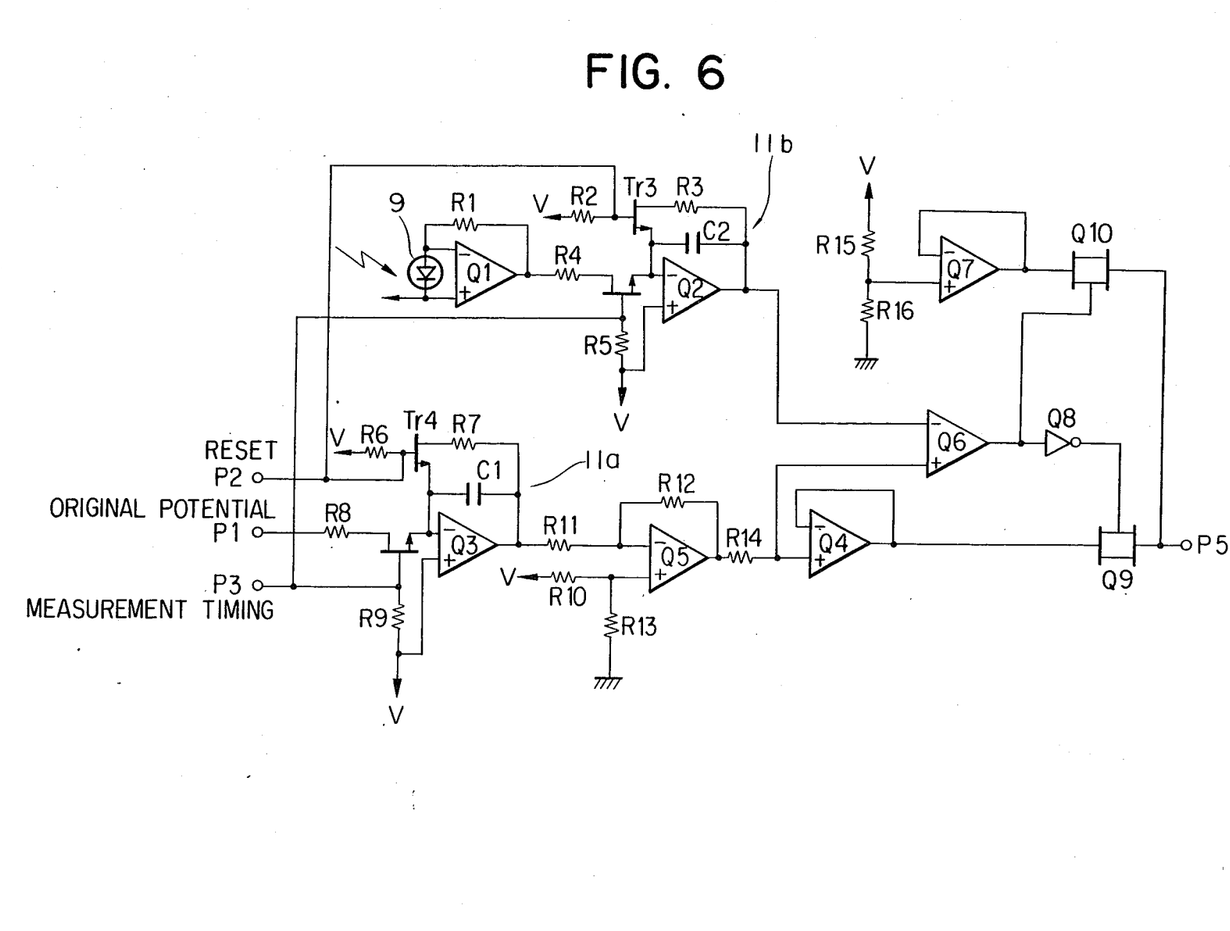
FIGS. 6, 8 and 9 are circuit diagrams, each showing the control circuit of an embodiment of the present invention.

FIG. 6 is a circuit diagram showing an embodiment of the control circuit, 11, shown in FIG. 2, in which $R_1$ to $R_{16}$ each represent resistance, $C_1$ and $C_2$ are each condensers, $Q_1$ to $Q_7$ are each OPAMP (operational amplifier), $T_{r1}$ to $T_{r4}$ are each FET transistors, $Q_8$ is an inverter, and $Q_9$ and $Q_{10}$ are each an analog switch element.

The detected signal from the potential sensor 10 enters through the terminal, $P_1$, and the potential of the photosensitive body, 7, is measured by the first mirror integrator composed of resistance $R_8$, OPAMP $Q_3$ and condenser $C_1$. The light quantity reflected from the original is detected by the photosensor, 9, such as a photo diode, and is measured by the second mirror integrator composed of resistance $R_4$, OPAMP $Q_2$ and condenser $C_2$.

Prior to the measurement of the density of an original, a re-set signal is charged from terminal $P_2$, and the first integrator 11 is reset by FET transistor $T_{r4}$ and resistance $R_7$. When the density of the original is measured by the detected signal from the potential sensor, 10, the exposure lamp 2 scans the original with a quantity of light corresponding to the result of the measurement, so as to produce a copy image having proper density.

The mirror integrators, $11_a$ and $11_b$, are each connected with FET transistors, $T_{r1}$ and $T_{r2}$. Only when the density of the original is measured, the gauge potential of each becomes H(High) level, and the resistance between the drain-sources becomes smaller, by measurement of a timing signal from the terminal $P_3$. Then the integration is effected by an integration constant determined by the respective values of the resistances $R_8$, $R_4$ and condensers $C_1$, $C_2$.

The detected signal from the potential sensor 10 obtained by detecting the potential of the photosensitive body, 7, is integrated by the first mirror integrator, $11_a$, and inversely amplified by the OPAMP $Q_5$. This inversely amplified output voltage from the OPAMP $Q_5$, and the output voltage from OPAMP $Q_2$, corresponding to the reflected light quantity from the original, are compared and, when the difference between the output voltages is greater than the set value, or if the density values of the original detected by the two sensors differs by more than the set value, the original is scanned with a pre-set exposure light quantity. In the case of FIG. 6, if the density of the original detected by the photo sensor, 9, is smaller than that detected by the potential sensor, 10, the analog switch element $Q_9$ is turned off by the output of OPAMP $Q_6$ and the analog switch element $Q_{10}$ is turned on. Then, data constituting the output (voltage) pre-set by the resistances $R_{15}$ and $R_{16}$ is charged into the light quantity control circuit, 17. The quantity of light exposure of lamp 2 can be controlled to an optimum level by absorbing the detection error of the sensor which detects the density of the original.

Figure 7:
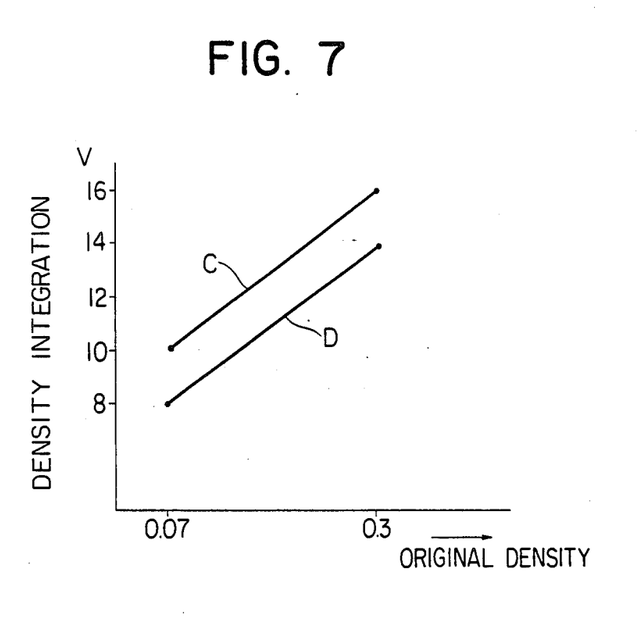
FIG. 7 is a graph showing the relationship between the integrated density and density of the original corresponding to the density of the latter.

FIG. 7 is a graph showing the relationship between the density-integrated quantity (voltage), corresponding to the density of the original as integrated by the said integrators, 11a, 11b, and the density of the original. When the density values detected by the potential sensor, 10, and photo sensor, 9, are of the same value, the respective integration constants are pre-set, so that the output of the integrator, 11b, becomes C, and the output of the integrator, 11a, becomes D. When the sensors detect the same value for the density of the original, the integrator, 11a, or the potential sensor, 10, gives a lower output, and the exposure light quantity of exposure lamp, 2, is controlled, based on the detection signal from the potential sensor, 10.

As indicated in FIG. 5, the area of the original detectable by the potential sensor is small. However, when the detected density of the original is larger than that detected by the photosensor, 9, which detects an area of the original greater than that covered by the potential sensor, 10, the exposure light quantity of the exposure lamp 2 is controlled to the pre-set level of the exposure quantity. Thus, an exact control of the exposure quantity can be effected by absorbing the detection error of the potential sensor.

Figure 8:
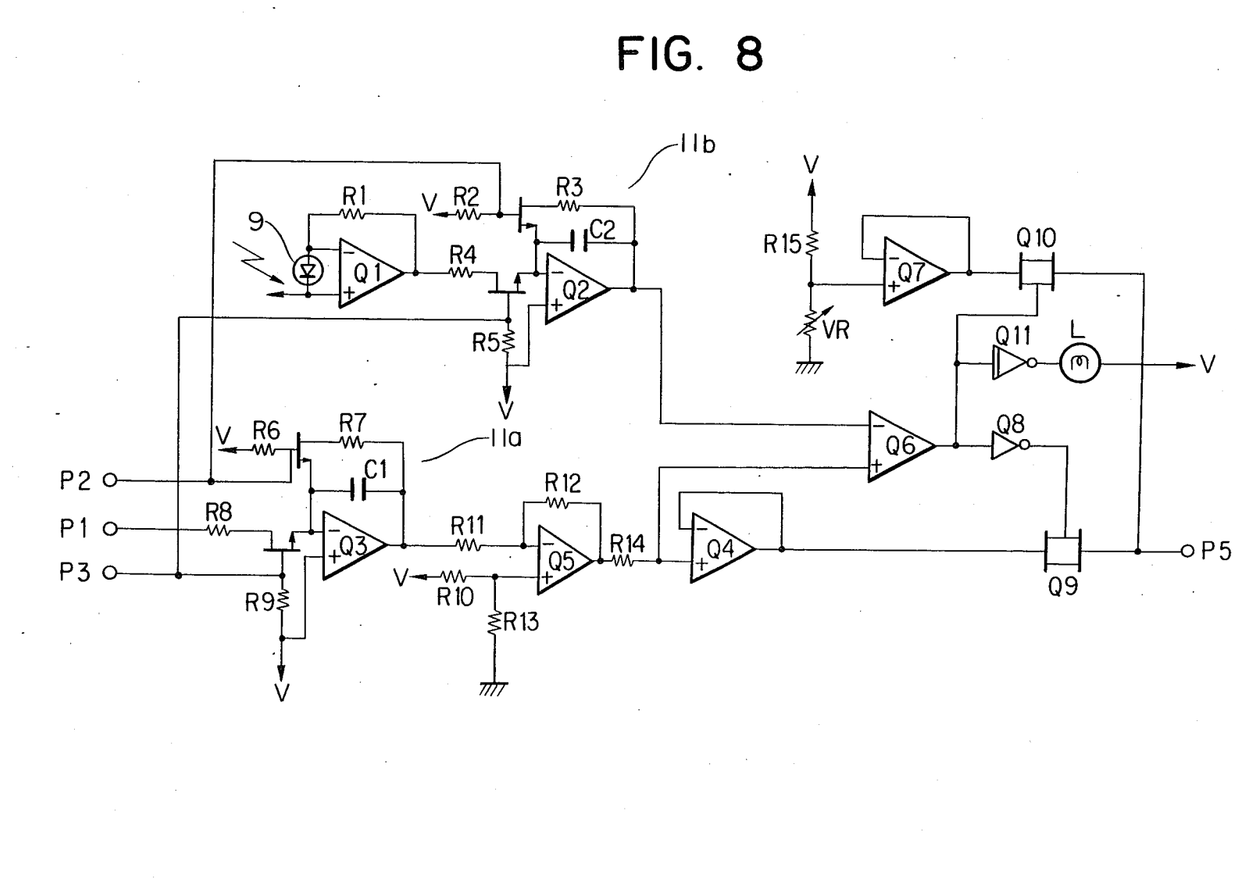

When the difference between the density values detected by the photo sensor and the potential sensor is greater than the pre-set value, the apparatus can be composed so as to switch the auto density setting mode to the manual density setting mode. FIG. 8 is a control circuit diagram for this last case, in which the parts are designated by the same numerals as those in FIG. 6.

In FIG. 8, VR is a variable resistance for a manual density setting, L is a lamp indicating the manual density setting mode, $Q_{11}$ is a driver for driving and switching the lamp L. When the density of the original, as detected by the photo sensor 9, is lower than that detected by the potential sensor, 10, the analog switch element, $Q_{10}$, is turned off, and the analog switch, $Q_1$, is turned on by the output of the OPAMP $Q_6$. Then, the output (voltage) set by the variable resistance VR for manual density setting circuit, 17, and the lamp, L, is switched on to indicate the manual density control mode. Thus, when the error of the sensors in detecting the density of the original is found, the mode can be changed to the manual setting mode. The system can also be composed so that the density of the original is detected by the photo sensor, 9, and the potential sensor, 10, the image forming conditions are controlled, based on a signal issued from either one of them, and the image-forming conditions are delimited by a signal issued from the other one.

Figure 9:
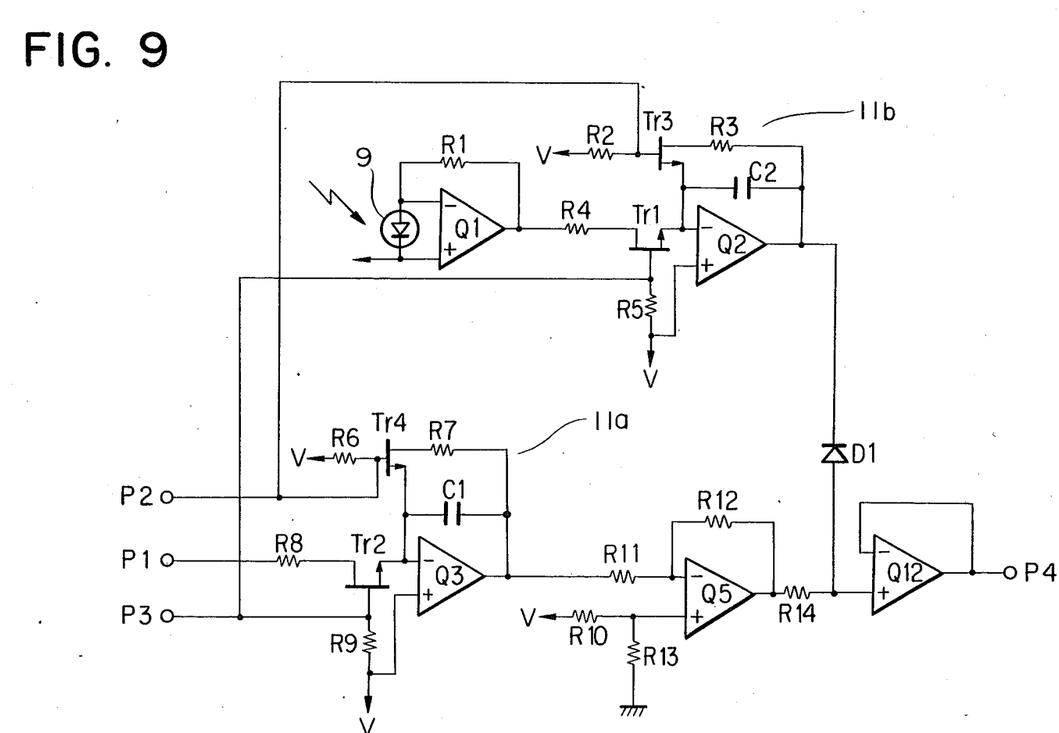

FIG. 9 is a diagram of the control circuit used for such a case, in which the numerals are the same as those of FIG. 6. In FIG. 9, $Q_{12}$ denotes OPAMP, and $D_1$ denotes a diode. The detection sign, 1, from the potential sensor, 10, detecting the potential of the photo-sensitive body, 7, is integrated by the first mirror integrator, 11a, and inversely amplified by the OPAMP $A_5$. When this inversely amplified output-potential of the OPAMP $Q_5$ is smaller than the output potential of OPAMP $Q_2$, corresponding to the reflected light quantity measured by the second mirror integrator 11b, the exposure light quantity of the exposure lamp 2 is controlled by the output potential of the integrator, 11a. Further, when the output potential of the integrator, 11a, is higher than that of the other integrator, 11b, the exposure light quantity of the exposure lamp 2, controlled by the output potential of the integrator, 11a, is delimited by the output potential of the integrator, 11b. In other words, the exposure light quantity of the exposure lamp 2 is controlled by a signal from the potential sensor, 10, and is delimited by a detection signal from the photo sensor, 9. The control signal is issued via the terminal $P_4$ from the light quantity control circuit 17. The system may be arranged so that the exposure light quantity of the exposure lamp 2 is controlled on the basis of a detection signal from the photo sensor, 9. When the difference between the density values of the potential sensor, 10, and that of the photo sensor, 9, exceeds the pre-set value, the exposure light quantity of the exposure lamp 2 is controlled by a signal from the photo sensor, 9.

In the above system, it is arranged so that the exposure light quantity is controlled on the basis of the detected density of the original. However, the system may be so composed as to control either the charged quantity, or the development bias potential. In the above arrangement, the system is composed so as to allow the density of the original to be detected by the surface potential of the photosensitive drum. It may be recomposed, so that the density of the image after the development is detected.

The invention is not limited to the above-described embodiments, but may be modified to the extent of the following claims.

What we claim is:
1. An image forming apparatus comprising:
   image forming means for forming an image of an original on a recording medium;
   first detection means for detecting an image density of said image formed on the recording medium;
   second detection means for detecting the density of said original image, other than said image formed on the recording medium; and
   control means for controlling said image forming means in accordance with outputs of said first and second detection means, wherein said control means compares the output values of the said first and second detection means and, when the difference between them is lower than a predetermined value, controls said image-forming means in response to the output of the first detection means.

2. An image forming apparatus according to claim 1, wherein said first detection means has a sensor for detecting the state of the surface of recording medium.

3. An image forming apparatus according to claim 2, wherein said sensor is a potential sensor for detecting the surface potential.

4. An image forming apparatus according to claim 1, wherein said second detection means has a photo sensor for detecting the light quantity from the original image.

5. An image forming apparatus comprising:
   image forming means for forming an image of an original on a recording medium;
   first detection means for detecting an image density of said image formed on the recording medium;

second detection means for detecting the density of said original image, other than said image formed on the recording medium; and control means for controlling said image forming means in accordance with outputs of said first and second detection means, wherein said control means compares the output values of the said first and second detection means and, when the difference between them is higher than a predetermined value, controls said image-forming means responsive to data having no relationship with the detected density of the original image.

6. An image forming apparatus according to claim 1 or 5, wherein said image forming means has an exposure means for exposing the original image and said control means controls the light quantity of said exposure means.

7. An image forming apparatus according to claim 5, wherein said data is a fixed data.

8. An image forming apparatus according to claim 5 wherein said data is variable.

9. An image forming apparatus comprising:
image forming means for forming an image of an original on a recording medium;
detection means for detecting a state of the image of an original;
setting means for setting a desired image;
control means capable of adjusting the density of a formed image in a first mode by controlling said image forming means responsive to an output of the detection means, and in a second mode by controlling said image forming means responsive to an output of the setting means; and
selection means for selecting said first mode or said second mode, responsive to the detected state of the original image, wherein said selection means has another detection means for detecting the density of the original image and compares the output values of the first detection means and the second detection means and selects said first mode or said second mode, based on the difference of the values.

10. An image forming apparatus according to claim 9, wherein said detection means has a first sensor for detecting the density of the original image through a recording medium.

11. An image forming apparatus according to claim 9, wherein said another detection means has a second sensor for detecting the density of the original image, but not through the recording medium.

12. An image forming apparatus according to claim 11, wherein said first sensor is a sensor for detecting the state of a surface of the recording medium.

13. An image forming apparatus according to claim 12, wherein said first sensor is a potential sensor for detecting the surface potential.

14. An image forming apparatus according to claim 11, wherein said second sensor is a photo sensor for detecting the light quantity from the original image.

15. An image forming apparatus according to claim 9, wherein said selection means selects said first mode when said difference is lower than a predetermined value, and said selection means selects said second mode when said difference is larger than a predetermined value.

16. An image forming apparatus comprising:
image forming means for forming an image of an original on a recording medium;
detection means for detecting the density of an original;
controlling means for controlling the density of an image in a first mode by controlling said image forming means responsive to an output of said detection means, and in a second mode by controlling said image forming means according to a predetermined value; and
selection means for selecting said first mode or said second mode, according to the state of an original image, wherein said detection means has another detection means for detecting the density of the original image and compares the outputs of said detection means and said other detection means to select said first mode or said second mode, according to the difference therebetween.

17. An image forming apparatus according to claim 16, wherein said detection means has a first sensor for detecting the density of the original image through the recoring medium.

18. An image forming apparatus according to claim 17, wherein said first sensor is a sensor for detecting the state of the surface of the recording medium.

19. An image forming apparatus according to claim 18, wherein said first sensor is a potential sensor for detecting a surface's potential.

20. An image forming apparatus according to claim 16, wherein said another selection means has a second sensor for detecting the density of the original image, but not through the recording medium.

21. An image forming apparatus according to claim 20, wherein said second sensor is a photo sensor for detecting the light quantity from an original image.

22. An image forming apparatus according to claim 16, wherein said selection means selects said first mode when said difference is smaller than said predetermined value and selects said second mode when said difference is larger than said pre-set value.

23. An image forming apparatus comprising:
image forming means for forming an image of an original on a recording medium;
first and second detection means for detecting the density of an original image;
control means for controlling said image forming means, responsive to said first detection means, and
limiting means for limiting the output of said first detection means by the output of said second detection means, wherein said first detection means has a sensor for detecting a state of the surface of a recording medium.

24. An image forming apparatus according to claim 23, wherein said image forming means has an exposure means for exposing the original image and said control means that controls the light quantity of said exposure means.

25. An image forming apparatus according to claim 23, wherein said sensor is a potential sensor for detecting a surface's potential.

26. An image forming apparatus according to claim 23, wherein said second detection means has a photo sensor for detecting the light quantity reflected from an original image.

27. An image forming apparatus comprising:
image forming means for forming an image, corresponding to an original image, on a recording medium;
first detection means for detecting the density of the original image formed on the recording medium;

second detection means for detecting the density of an image of the original, other than the image formed on the recording medium; and control means, including means for comparing detectin values of said first and second detection means, for controlling an operational condition of said image forming means in accordance with a detected value of a predetermined one of said first and second detection means, in the event that the detected values of said first and second detection means have a predetermined relation therebetween as determined by said comparing means.

28. An image forming apparatus according to claim 27, wherein said control means compares the output values of said first and second detection means and, when the difference between them is lower than a predetermined value, it controls said image forming means in response to the output of the first detection means.

29. An image forming apparatus according to claim 28, wherein said image forming means has an exposure means for exposing an original image and said control means controls the light quantity of said exposure means.

30. An image forming apparatus according to claim 27, wherein said control means compares the output values of said first and second detection means and, when the difference between them is higher than a predetermined value, it controls said image forming means responsive to data having no relationship with the detected density of the original image.

31. An image forming apparatus according to claim 30, wherein said data is a fixed data.

32. An image forming apparatus according to claim 30, wherein said data is variable.

33. An image forming apparatus according to claim 27, wherein said first detection means has a sensor for detecting a state of surface condition of the recording medium.

34. An image forming apparatus according to claim 33, wherein said sensor is a potential sensor for detecting the surface potential.

35. An image forming apparatus according to claim 27, wherein said second detection means has a photosensor for detecting the light quantity from the original image.

36. An image forming apparatus comprising:
image forming means for forming an image corresponding to an original image on a recording medium;
detection means for detecting a density of the original image;
setting means for setting a desired density of the image to be formed by said image forming means;
control means capable of adjusting the density of the formed image in a first mode by controlling said image forming means, responsive to an output of the detection means, and in a second mode for adjusting the density of the formed image by controlling said image forming means responsive to an output of the setting means; and
selection means for selecting said first mode or said second mode, responsive to the output of said detecting means.

37. An image forming apparatus according to claim 36, wherein said selection means has another detection means for detecting the density of the original image and compares the output values of the first detection means and the second detection means and selects said first mode or said second mode, based on the difference of the values.

38. An image forming apparatus according to claim 37, wherein said other detection means has a second sensor for detecting the density of the original image, other than the image formed on the recording medium.

39. An image forming apparatus according to claim 38, wherein said first sensor is a sensor for detecting a state of a surface condition of the recording medium.

40. An image forming apparatus according to claim 39, wherein said first sensor is a potential sensor for detecting the surface potential of the recording medium.

41. An image forming apparatus according to claim 39, wherein said second sensor is a photosensor for detecting the light quantity from the image of the original.

42. An image forming apparatus according to claim 37, wherein said selection means selects said first mode when said difference is lower than a predetermined value, and said selection means selects said second mode when said difference is larger than a predetermined value.

43. An image forming apparatus according to claim 36, wherein said detection means has a first sensor for detecting the density of the original image formed on the recording medium.

44. An image forming apparatus comprising:
image forming means for forming an image corresponding to an original image on a recording medium;
first detection means for detecting the density of the original image;
second detection means for detecting the density of the original image;
controlling means for controlling the density of the formed image in a first mode for controlling the density of image by controlling said image forming means responsive to the output of said first detection means, and in a second mode by predetermined value; and
selection means for selecting said first mode or said second mode in accordance with the output of said first detection means and the output of said second detection means.

45. An image forming apparatus according to claim 44, wherein said selection means compares the outputs of said first detection means and said second detection means to select said first mode or said second mode, according to the difference therebetween.

46. An image forming apparatus according to claim 45, wherein said first detection means has a first sensor for detecting the density of the original image formed on the recording medium.

47. An image forming apparatus according to claim 46, wherein said first sensor is a sensor for detecting a surface condition of the recording medium.

48. An image forming apparatus according to claim 47, wherein said first sensor is a potential sensor for detecting the surface potential of the recording medium.

49. An image forming apparatus according to claim 47, wherein said second sensor is a photosensor.

50. An image forming apparatus according to claim 46, wherein said first sensor is a sensor for detecting a surface condition of the recording medium.

51. An image forming apparatus according to claim 45, wherein said second detection means has a second sensor for detecting the density of the original image, other than the image formed on the recording medium.

52. An image forming apparatus according to claim 45, wherein said selection means selects said first mode when said difference is smaller than said predetermined value and selects said second mode when said difference is larger than said predetermined value.

53. An image forming apparatus comprising:
- image forming means for forming an image corresponding to an original image on a recording medium;
- first detecting means for detecting a density of the original image formed on the recording medium;
- second detection means for detecting the density of the original image, other than the image formed on the recording medium;
- control means for controllig said image forming means in accordance with an output of either one of said first or second detection means; and
- limiting means for limiting the output of said one detecting means in accordance with the output of the other of said detecting means.

54. An image forming apparatus according to claim 53, wherein said image forming means has an exposure means for exposing the original image and control means for controlling the light quantity of said exposure means.

55. An image forming apparatus according to claim 53, wherein said first detection means has a sensor for detecting a surface condition of the recording medium.

56. An image forming apparatus according to claim 55, wherein said sensor is a potential sensor for detecting the surface potential of the recording medium.

57. An image forming apparatus according to claim 57, wherein said second detection means has a photosensor for detecting the light quantity reflected from an original image.

* * * * *

UNITED STATES PATENT AND TRADEMARK OFFICE
CERTIFICATE OF CORRECTION

PATENT NO. : 4,674,863

DATED : June 23, 1987

INVENTOR(S) : MASAHIRO TOMOSADA, ET AL.

It is certified that error appears in the above-identified patent and that said Letters Patent is hereby corrected as shown below:

IN THE DRAWING FIGURES - SHEET 3 OF 7

Figure 4, "QUNTITY" should read --QUANTITY--.

COLUMN 1

Line 13, "machines," should read --machine,--.

COLUMN 2

Line 26, "the" should read --in the--.
    Line 61, "a arrangement" should read --a mirror arrangement--.

COLUMN 5

Line 48, "$Q_1$," should read --$Q_{11}$,--.

COLUMN 6

Line 57, "of recording" should read --of the recording--.

COLUMN 7

Line 20, "5" should read --5,--.

COLUMN 8

Line 20, "recoring" should read --recording--.

COLUMN 9

Line 4-5, "detectin" should read --detection--.

UNITED STATES PATENT AND TRADEMARK OFFICE
CERTIFICATE OF CORRECTION

PATENT NO. : 4,674,863
DATED : June 23, 1987
INVENTOR(S) : MASAHIRO TOMOSADA, ET AL.

It is certified that error appears in the above-identified patent and that said Letters Patent is hereby corrected as shown below:

COLUMN 9

Line 21, "an" should read --the--.

COLUMN 10

Line 40, "by predeter-" should read --by controlling said image forming means according to a predeter- --.

COLUMN 11

Line 17, "controllig" should read --controlling--.

COLUMN 12

Line 16, "57," should read --53,--.

Signed and Sealed this

Seventeenth Day of November, 1987

Attest:

DONALD J. QUIGG

Attesting Officer

Commissioner of Patents and Trademarks